(12) United States Patent
Swartzlander et al.

(10) Patent No.: US 10,318,242 B2
(45) Date of Patent: Jun. 11, 2019

(54) MEMRISTOR-BASED MULTIPLIERS USING MEMRISTORS-AS-DRIVERS (MAD) GATES

(71) Applicant: Board of Regents, The University of Texas System, Austin, TX (US)

(72) Inventors: Earl Swartzlander, Austin, TX (US); Lauren Guckert, Austin, TX (US)

(73) Assignee: Board of Regents, The University of Texas System, Austin, TX (US)

( * ) Notice: Subject to any disclaimer, the term of this patent is extended or adjusted under 35 U.S.C. 154(b) by 0 days.

(21) Appl. No.: 16/115,123

(22) Filed: Aug. 28, 2018

(65) Prior Publication Data

US 2019/0079731 A1 Mar. 14, 2019

Related U.S. Application Data

(60) Provisional application No. 62/556,122, filed on Sep. 8, 2017.

(51) Int. Cl.
| | |
|---|---|
| *G06F 7/523* | (2006.01) |
| *G06F 7/507* | (2006.01) |
| *G06F 7/501* | (2006.01) |
| *G11C 13/00* | (2006.01) |

(52) U.S. Cl.
CPC .............. *G06F 7/507* (2013.01); *G06F 7/501* (2013.01); *G06F 7/523* (2013.01); *G11C 13/0021* (2013.01)

(58) Field of Classification Search
CPC .......... G06F 7/4876; G06F 7/50–7/508; G06F 7/523–7/5338
See application file for complete search history.

(56) References Cited

U.S. PATENT DOCUMENTS

| | | |
|---|---|---|
| 7,902,857 B1 | 3/2011 | Pino |
| 8,525,553 B1 | 9/2013 | Yi et al. |
| 8,773,167 B2 | 7/2014 | Robinett et al. |
| 9,685,954 B2 | 6/2017 | Kvatinsky et al. |

(Continued)

FOREIGN PATENT DOCUMENTS

WO 2017144862 A1 8/2017

OTHER PUBLICATIONS

S. Shin, K. Kim, S. M. Kang, "Resistive computing: Memristors-enabled signal multiplication", IEEE Trans. Circuits Syst. I Reg. Papers, vol. 60, No. 5, pp. 1241-1249, May 2013 (Year: 2013).*

(Continued)

*Primary Examiner* — Matthew D Sandifer
(74) *Attorney, Agent, or Firm* — Robert A. Voigt, Jr.; Winstead, P.C.

(57) ABSTRACT

Memristor-based multipliers using memristors-as-drivers (MAD) gates. As a result of employing MAD gates in memristor-based multipliers, such as shift-and-add multipliers, Booth multipliers and array multipliers, the number of delay steps may be less than half than the number of delay steps required in traditional CMOS implementations of multipliers. Furthermore, by using MAD gates, memristor-based multipliers can be implemented with less complexity (e.g., fewer memristors and drivers). As a result, by the memristor-based multipliers using MAD gates, the speed and complexity of a wide variety of arithmetic operations is improved.

14 Claims, 9 Drawing Sheets

(56) References Cited

U.S. PATENT DOCUMENTS

| | | | |
|---|---|---|---|
| 9,921,808 B1 | 3/2018 | Swartzlander et al. | |
| 9,971,564 B1* | 5/2018 | Swartzlander | G06F 7/501 |
| 10,169,297 B2* | 1/2019 | Buchanan | G06F 7/5443 |
| 10,180,820 B2* | 1/2019 | Buchanan | G06F 7/523 |
| 2011/0121359 A1 | 5/2011 | Yang et al. | |
| 2012/0014169 A1 | 1/2012 | Snider | |
| 2013/0311413 A1 | 11/2013 | Rose et al. | |
| 2013/0313623 A1 | 11/2013 | Vrudhula et al. | |
| 2014/0028347 A1 | 1/2014 | Robinett et al. | |
| 2015/0256178 A1 | 9/2015 | Kvatinsky et al. | |
| 2016/0020766 A1 | 1/2016 | Miao et al. | |
| 2016/0189772 A1 | 6/2016 | Mohammad et al. | |
| 2017/0243645 A1 | 8/2017 | Chia et al. | |
| 2017/0317680 A1 | 11/2017 | Ge et al. | |
| 2017/0337968 A1 | 11/2017 | Jagtap | |
| 2018/0159536 A1 | 6/2018 | Swartzlander et al. | |

OTHER PUBLICATIONS

S. Haghiri, A. Nemati, S. Feizi, A. Amirsoleimani, A. Ahmadi and M. Ahmadi, "A memristor based binary multiplier," 2017 IEEE 30th Canadian Conference on Electrical and Computer Engineering (CCECE), pp. 1-4, 2017 (Year: 2017).*

Bickerstaff et al., "Memristor-based Arithmetic," Conference Record of the 44th Asilomar Conference on Signals, Systems and Computers (ASILOMAR), Pacific Grove, CA, United States, Nov. 7-10, 2010, pp. 1173-1177.

Kvatinsky et al., "Memristor-Based Material Implication (IMPLY) Logic: Design Principles and Methodologies," IEEE Transactions on Very Large Scale Integration (VLSI) Systems, vol. 22, Issue 10, Oct. 2014, pp. 2054-2066.

Kvatinsky et al., "MAGIC—Memristor Aided LoGIC," IEEE Transactions on Circuits and Systems II: Express Briefs, vol. 61, Issue 11, Nov. 2014, pp. 895-899.

Mahajan et al., "Memristor Based Adders," Conference Record of the 48th Asilomar Conference on Signals, Systems and Computers, Pacific Grove, United States, Nov. 2-5, 2014, pp. 1256-1260.

Lauren C. Guckert, Memristor-Based Arithmetic Units, Ph.D. Defense, Oct. 28, 2016, pp. 1-166.

Kvatinsky et al., "MRL—Memristor Ratioed Logic," 13th International Workshop on Cellular Nanoscale Networks and Their Applications (CNNA), Aug. 29-31, 2012, pp. 1-6.

Teimoory et al., "Optimized Implementation of Memristor-Based Full Adder by Material Implication Logic," 21st IEEE International Conference on Electronics, Circuits and Systems (ICECS), Marseille, France, 2014, pp. 1-4.

Zhang et al., A Novel Design for Memristor-Based Logic Switch and Crossbar Circuits, IEEE Transactions on Circuits and Systems-I: Regular Papers, vol. 62, No. 5, May 2015, pp. 1402-1411.

Zhang et al., "A Novel Design for a Memristor-Based OR Gate," IEEE Transactions on Circuits and Systems-II: Express Briefs, vol. 62, No. 8, Aug. 2015, pp. 781-785.

Guckert et al., "MAD Gates—Memristor Logic Design Using Driver Circuitry," IEEE Transactions on Circuits and Systems II: Express Briefs, vol. PP, No. 99, Apr. 7, 2016, pp. 1-5.

Lauren Elise Guckert, "Memristor-Based Arithmetic Units," Dissertation Presented to the Faculty of the Graduate School of the University of Texas at Austin, Dec. 2016, pp. 1-255, see pp. 45-115.

Guckert et al., "MAD Gates—Memristor Logic Design Using Driver Circuitry," IEEE Transactions on Circuits and Systems II: Express Briefs, vol. 64, No. 2, Feb. 2017, pp. 1-5.

Guckert et al., "Optimized Memristor-Based Ripple Carry Adders," Asilomar Conference on Signals, Systems and Computers, Pacific Grove, California, United States of America, Nov. 8, 2016, pp. 1-5.

Shaltoot et al., "Memristor Based Carry Lookahead Adder Architectures," 2012 IEEE 55th International Midwest Symposium on Circuits and Systems (MWSCAS), Aug. 2012, pp. 298-301.

Revenna et al., "Memristor Based Adder Circuit Design," 2016 50th Asilomar Conference on Signals, Systems and computers, Nov. 2016, pp. 162-166.

* cited by examiner

MEMRISTOR-BASED MULTIPLIERS USING MEMRISTORS-AS-DRIVERS (MAD) GATES

TECHNICAL FIELD

The present invention relates generally to memristors, and more particularly to memristor-based multipliers using memristors-as-drivers (MAD) gates to improve the speed and complexity of arithmetic operations.

BACKGROUND

Memristors were first hypothesized by Leon Chua in 1971, and since then research has explored the potential for these devices in modern system design. The most direct benefits of memristors, low area and high density, lend themselves to improved memory design, sparking the majority of prior research. Only recently has research begun to explore the use of memristors in arithmetic applications. The work that has been done has focused on individual logic gates and small circuits. There have been numerous approaches to this endeavor: IMPLY operations, MAGIC gates, logic-in-memory, hybrid-CMOS gates, and threshold gates, to name the most prevalent.

Unfortunately, each prior approach to memristor-based logic has shortcomings. IMPLY gates are serialized and incur high delays for Boolean operations. Hybrid-CMOS gates suffer from signal degradation. MAGIC gates and logic-in-memory designs are limited in applications since they cannot be concatenated or provide multiple fanout. Threshold gates using GOTO pairs, although low in area and delay, are still in their infant stages in terms of fabrication.

Hence, all prior designs for memristor-based gates have had shortcomings in terms of scalability, applicability, completeness and performance. For example, multipliers using memristor-based gates have shortcomings in terms of delay and complexity (many transistors, memristors, switches and/or drivers).

SUMMARY

In one embodiment of the present invention, a shift-and-add multiplier comprises a first memristor, where the first memristor is connected to a first switch. The shift-and-add multiplier further comprises a second memristor connected in parallel to the first memristor, where the second memristor is connected to a second switch and a third switch, and where the second and third switches are connected in series. The shift-and-add multiplier additionally comprises a third memristor connected in parallel to the second memristor, where the third memristor is connected to a fourth switch, and where a fifth switch is connected to the second and third memristors. Furthermore, the shift-and-add multiplier comprises a fourth memristor connected in parallel to the third memristor, where the third memristor is connected to a sixth switch, a seventh switch and eighth switch. Additionally, the shift-and-add multiplier comprises a fifth memristor connected in parallel to the fourth memristor, where the fifth memristor is connected to a ninth switch, a tenth switch, an eleventh switch, a twelfth switch, a thirteenth switch and a fourteenth switch.

In another embodiment of the present invention, a shift-and-add multiplier comprises a first memristor, where the first memristor is connected to a first switch. The shift-and-add multiplier further comprises a second memristor connected in parallel to the first memristor, where the second memristor is connected to a second switch and a third switch, and where the second and third switches are connected in series. The shift-and-add multiplier additionally comprises a third memristor connected in parallel to the second memristor, where the third memristor is connected to a fourth switch, a fifth switch, a sixth switch, a seventh switch, an eighth switch, a ninth switch and a tenth switch, and where an eleventh switch is connected to the second and third memristors. Furthermore, the shift-and-add multiplier comprises a fourth memristor connected in parallel to the third memristor, where the fourth memristor is connected to a twelfth switch, a thirteenth switch and a fourteenth switch.

In a further embodiment of the present invention, a Booth multiplier comprises a first memristor connected to a first switch and a second switch. The Booth multiplier further comprises a second memristor connected in parallel to the first memristor, where the second memristor is connected to a third switch, a fourth switch, a fifth switch and a sixth switch. The Booth multiplier additionally comprises a third memristor connected in parallel to the second memristor, where the third memristor is connected to a seventh switch and an eighth switch. The first, second and third memristors are connected to a ninth switch. Furthermore, the Booth multiplier comprises a fourth memristor connected in parallel to the third memristor, where the fourth memristor is connected to a tenth switch, an eleventh switch, a twelfth switch, a thirteenth switch, a fourteenth switch, a fifteenth switch and a sixteenth switch, and where a seventeenth switch is connected to the third and fourth memristors. Additionally, the Booth multiplier comprises a fifth memristor connected in parallel to the fourth memristor, where the fifth memristor is connected to an eighteenth, a nineteenth switch and a twentieth switch.

In another embodiment of the present invention, an array multiplier comprises a first memristor connected to a first power source, a first switch and a second switch. The array multiplier further comprises a second memristor connected in parallel to the first memristor, where the second memristor is connected to a third switch, wherein a fourth switch is connected to the first and second memristors. The array multiplier additionally comprises a third memristor connected in parallel to the second memristor, where the third memristor is connected to a fifth switch. Furthermore, the array multiplier comprises a fourth memristor connected in parallel to the third memristor, where the fourth memristor is connected to a sixth switch and a seventh switch.

In a further embodiment of the present invention, an array multiplier comprises a first memristor connected to a first power source, a first switch and a second switch. The array multiplier further comprises a second memristor connected in parallel to the first memristor, where the second memristor is connected to a third switch, and where a fourth switch is connected to the first and second memristors. The array multiplier additionally comprises a third memristor connected in parallel to the second memristor, where the third memristor is connected to a fifth switch, a sixth switch and a seventh switch. Furthermore, the array multiplier comprises a fourth memristor connected in parallel to the third memristor, where the fourth memristor is connected to an eighth switch, a ninth switch, a tenth switch, an eleventh switch, a twelfth switch and a thirteenth switch.

The foregoing has outlined rather generally the features and technical advantages of one or more embodiments of the present invention in order that the detailed description of the present invention that follows may be better understood. Additional features and advantages of the present invention will be described hereinafter which may form the subject of the claims of the present invention.

BRIEF DESCRIPTION OF THE DRAWINGS

A better understanding of the present invention can be obtained when the following detailed description is considered in conjunction with the following drawings, in which.

DETAILED DESCRIPTION

In the following description, numerous specific details are set forth to provide a thorough understanding of the present invention. However, it will be apparent to those skilled in the art that the present invention may be practiced without such specific details. In other instances, well-known circuits have been shown in block diagram form in order not to obscure the present invention in unnecessary detail. For the most part, details considering timing considerations and the like have been omitted inasmuch as such details are not necessary to obtain a complete understanding of the present invention and are within the skills of persons of ordinary skill in the relevant art.

As stated in the Background section, memristors have recently begun to be explored in arithmetic operations. However, all prior designs for memristor-based gates have had shortcomings in terms of scalability, applicability, completeness and performance. For example, multipliers using memristor-based gates have shortcomings in terms of delay and complexity (many transistors, memristors, switches and/or drivers).

The principles of the present invention provide a new lower-power gate design, Memristors-As-Drivers gates (hereinafter "MAD" gates), which overcomes each of these issues by combining sense circuitry with the IMPLY operation. By using such MAD gates, memristor-based multipliers can be implemented with less complexity (e.g., fewer memristors and drivers) and delay. A discussion regarding the various types of memristor-based multipliers using MAD gates, such as shift-and-add multipliers, Booth multipliers and array multipliers, is provided below.

Figure 1:
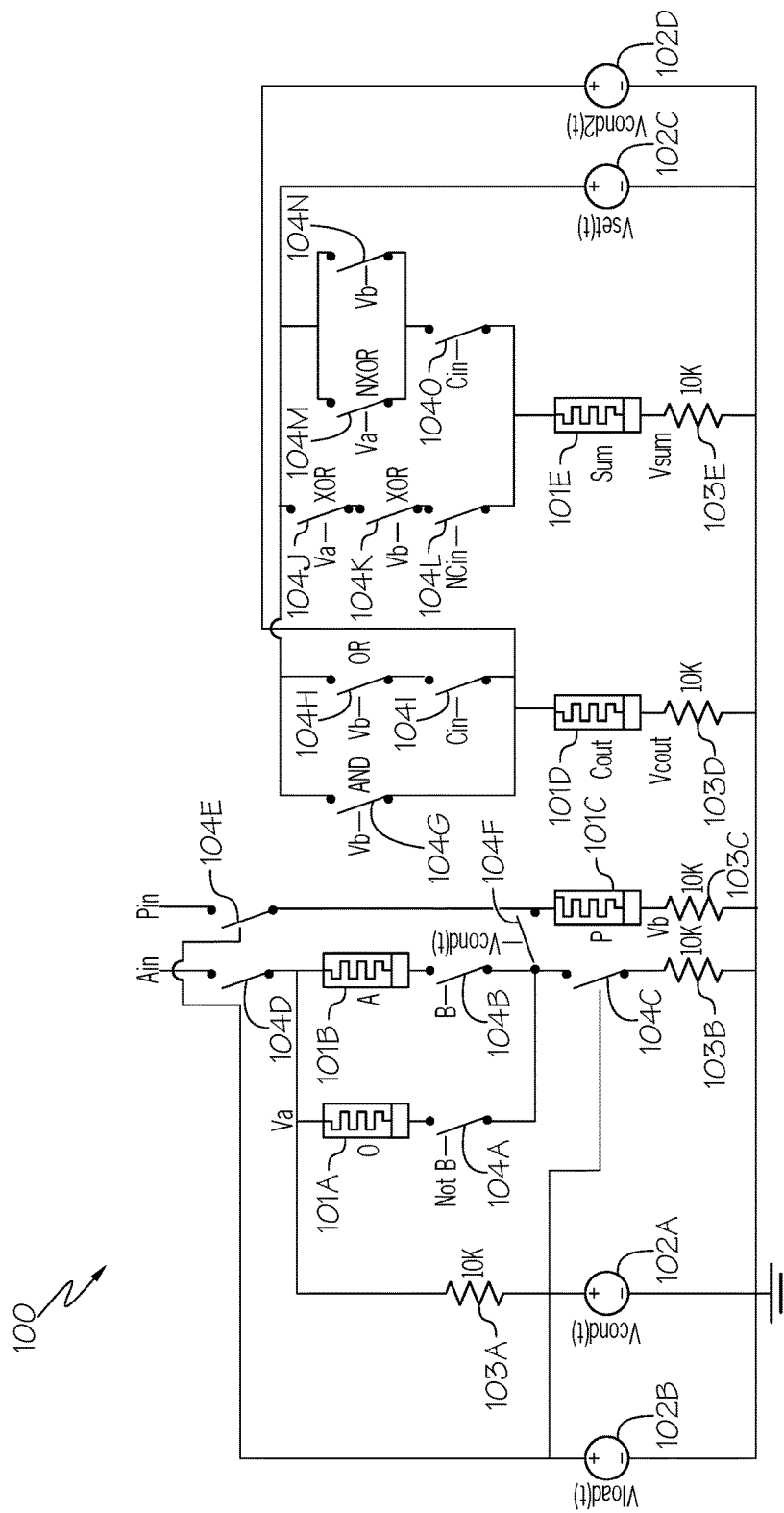
FIG. 1 illustrates a MAD full adder for a shift-and-add multiplier in accordance with an embodiment of the present invention.

Referring now to the Figures in detail, FIG. 1 illustrates a MAD full adder 100 for a shift-and-add multiplier in accordance with an embodiment of the present invention.

The design of the MAD full adder for the shift-and-add multiplier is optimized at a unit-level and at the macro level. First, the design minimizes the delay internal to each full adder in the ripple carry adder, then it focuses on optimizations across the logic block.

As discussed further below, MAD full adder 100 for the shift-and-add multiplier minimizes the delay internal to each full adder in the ripple carry adder. This design uses the optimized full adder which requires 4 memristors, 5 resistors, 13 switches, and 4 drivers and only 1 step as the baseline. Furthermore, information about the shift-and-add multiplier context may be leveraged to further reduce the number of elements of the full adder. The resultant full adder is shown in FIG. 1.

As shown in FIG. 1, adder 100 includes memristors 101A, 101B connected in parallel. Memristors 101A, 101B are connected to power source 102A (Vcond(t)) via resistor 103A (value of 10K ohms in one embodiment). Memristor 101A is further connected to switch 104A. Furthermore, memristor 101B is connected to switches 104B, 104C, which are connected in series. Switch 104B is connected in parallel to switch 104A. Furthermore, switch 104C is connected to ground via resistor 103B (value of 10K ohms in one embodiment). Furthermore, switch 104C is connected to power source 102B (Vload(t)).

Additionally, memristors 101A, 101B are connected to switch 104D, which is connected to power source 102B.

Furthermore, as shown in FIG. 1, memristor 101C is connected in parallel to memristor 101B. Furthermore, memristor 101C is connected to ground via resistor 103C (value of 10K ohms in one embodiment). Furthermore, memristor 101C is connected to switch 104E, which is connected to power source 102B (Vload(t)). Additionally, there is a switch 104F between memristors 101B, 101C which is driven by Vcond(t).

Additionally, as shown in FIG. 1, memristor 101D is connected in parallel to memristor 101C. Furthermore, memristor 101D is connected to ground via resistor 103D (value of 10K ohms in one embodiment). Additionally, memristor 101D is connected to switches 104G, 104H and 104I, where switches 104H, 104I are connected in series and the combination of switches 104H, 104I is connected in parallel to switch 104G. Furthermore, switches 104G, 104H are connected to power source 102C (Vset(t)) and memristor 101D is connected to power source 102D (Vcond2($t$)).

Furthermore, as shown in FIG. 1, memristor 101E is connected in parallel to memristor 101D. Memristor 101E is connected to ground via resistor 103E (value of 10K ohms in one embodiment). Additionally, memristor 101E is connected to switches 104J, 104K, 104L, 104M, 104N and 104O, where switches 104M, 104N are connected in parallel and the combination of switches 104M, 104N is connected in series to switch 104O. Furthermore, the combination of switches 104M, 104N and 104O is connected in parallel to the combination of switches 104J, 104K and 104L, where switches 104J, 104K and 104L are connected in series. Furthermore, switches 104J, 104M and 104N are connected to power source 102C.

Referring to FIG. 1, the P memristor represents the bit operand of the running product register while A and B represent the multiplicand and multiplier. The output circuitry remains unchanged.

A memristor, labelled '0' (memristor 101A), has been added in parallel with the A input memristor (memristor 101B). In a shift-and-add multiplier, both the '0' and 'A' inputs to the multiplexer are known and constant throughout the iterations. Thus, rather than having a single input A memristor (memristor 101B), this adder has two memristors to hold the value of the multiplicand (A) and the value 0. These represent the two inputs to the multiplexer in the multiplier.

The value of A can be loaded once at the beginning of the multiplication and held resident in the full adders for the entire multiplication. This is possible because memristors in the MAD context perform logic and storage operations. This optimization removes the need for the multiplicand register entirely since the multiplicand now lies in the full adders permanently. This also eliminates the overhead of copying the multiplicand operand into the ripple carry adder during each iteration. Thus, both area and latency are improved. In one embodiment, there is an option to replace the '0' memristor with a resistor $R_m$ such that $R_m=R_{high}$. This achieves the same behavior and is left as a design-time decision to optimize complexity.

At initialization, the $V_{load}$ signal is driven high and the value of the multiplicand operand A is set by $A_{in}$. The multiplier is also set into a separate N-bit register of N memristors and switches. Then, at the beginning of each iteration i, the value of the product register is set by $P_{in}$ into the P memristor. This happens once per iteration since the value of P changes across iterations.

In the next step, the multiplier and carry-in bit are both sensed simultaneously to resolve the full adder in a single step. The multiplier bit $B_i$ and its inverse are sensed by applying the read voltage $V_{cond}$ to it in the multiplier register. The voltages are used as the drivers on the switches labeled 'NOT B' and 'B' (switches 104A, 104B, respectively). This is identical to the sensing behavior each full adder in a MAD ripple carry adder does to read its carry-in signal and resolve its outputs.

The p terminal of the multiplier memristor will be read for B and the n-terminal will be read for NOT B. Depending on the voltages read at the terminals of the multiplier memristor, the gate will close for either the multiplicand, A, or the '0' memristor (memristor 101A) for the addition.

If B is a '1', the voltage at the p terminal will be large enough to satisfy the threshold to close the B gates. The voltage at the n terminal will not be large enough to satisfy the threshold to close the 'NOT B' gates. If B is a '0', the opposite is true. If B is a '0', the voltage at the p terminal will not be large enough to satisfy the threshold to close the B gates. The voltage at the n terminal will be large enough to satisfy the threshold to close the 'NOT B' gates.

Exactly one of the switches will close and the standard MAD voltage division circuit for the inputs will be created with the P memristor as the second input operand. This incorporates the multiplexer functionality into the adder without any delay. It comes at the cost of two switches in the full adder. At this time, $V_{cond}$ is applied to connect the selected input A and the product memristor in series to ground. $V_{cond}$ is also applied to the carry-in bit in the previous adder (indicated by the value of $C_{in}$).

The voltages at $V_a$ and $V_b$ resolve the final carry-out and sum memristors as normal. The gates are labeled 'AND' and 'OR' (gates of switches 104G, 104H, respectively) to indicate the Boolean operation achieved by the given threshold voltage of that gate. For example, the AND switch 104G only closes when the voltage sensed at node $V_b$ is greater than the threshold voltage denoting that both inputs are '1'. Similarly, the OR switch 104H only closes when the voltage sensed at $V_b$ is greater than the threshold voltage denoting that at least one input is a '1'.

In one embodiment, the shift-and-add multiplier is optimized by removing the need for a shift register. In such an embodiment, the result of the addition is stored directly back into the input operand in the adder, performing the shift at the same time.

If the design used a ripple carry adder and a shift register, there would be a large overhead associated with data movement between each iteration. The ripple carry would complete and resolve the sum in the sum memristors. A MAD copy operation would store the sum into the shift register. Then, another copy operation would shift each value into the next bit in the register. Finally, another copy operation would store the shifted product into the P bits in the MAD.

In one embodiment, the design of the present invention foregoes all of the copy operation and each full adder i stores its sum directly into the previous full adder i+1 in the chain. The design will largely remain unchanged except that the logic shown in FIG. 1 for the sum memristor, will now be resolving $sum_{i-1}$. Essentially, the block of logic that is resolving the sum in a full adder is moved in its entirety to the previous full adder.

The same signals are sensed, the same drivers are used, the same Boolean expressions are operated, and the same threshold voltages are used. The only difference is that it occurs to a memristor in a different location in the design. To perform this, rather than applying $V_{set}$ to the sum memristor in full adder i, $V_{set}$ is applied to the sum memristor in full adder i−1. This achieves the shift functionality as part of the addition steps. This is possible because the sum memristor and its drivers are completely independent from the rest of the circuit. The design no longer needs the product shift register or the accompanying shift delay.

At the end of an addition, the design has successfully performed a shift operation. The sum from bits [N−1:0] essentially lies in bits [N−2:0] now. However, before the next addition can begin, the new sum needs to be in the P input memristors.

As a result, the design may be modified by selecting the P memristor (memristor 101C) in the previous bit as opposed to the sum memristor (memristor 101E). In other words, the driver and switch logic shown for the sum memristors (memristor 101E) will actually be performed on the P memristor (memristor 101C). Cumulatively, the full adder is modified to store into the previous bit's P memristor (memristor 101C) rather than its own sum memristor (memristor 101E). An illustration of the modified MAD full adder for a shift-and-add multiplier is described below in connection with FIG. 2.

Figure 2:
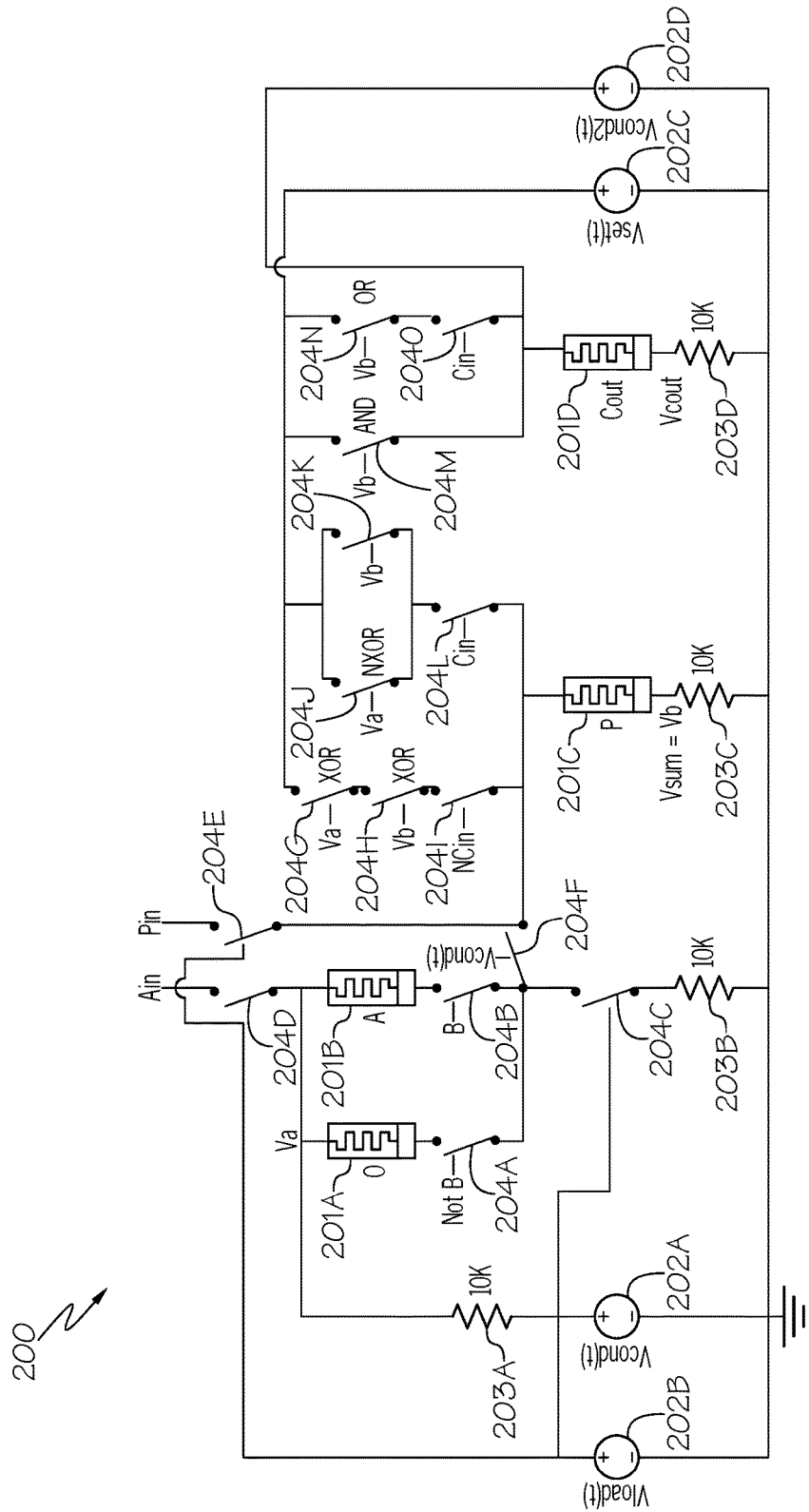
FIG. 2 illustrates an optimized MAD full adder for the shift-and-add multiplier in accordance with an embodiment of the present invention.

Referring to FIG. 2, FIG. 2 illustrates an optimized MAD full adder 200 for the shift-and-add multiplier in accordance with an embodiment of the present invention.

As shown in FIG. 2, adder 200 includes memristors 201A, 201B connected in parallel. Memristors 201A, 201B are connected to power source 202A (Vcond(t)) via resistor 203A (value of 10K ohms in one embodiment). Memristor 201A is further connected to switch 204A. Furthermore, memristor 201B is connected to switches 204B, 204C, which are connected in series. Switch 204B is connected in parallel to switch 204A. Furthermore, switch 204C is connected to ground via resistor 203B (value of 10K ohms in one embodiment). Furthermore, switch 204C is connected to power source 202B (Vload(t)).

Additionally, memristors 201A, 201B are connected to switch 204D, which is connected to power source 202B.

Additionally, there is a switch 204F between memristors 201B, 201C which is driven by Vcond(t).

Furthermore, as shown in FIG. 2, memristor 201C is connected in parallel to memristor 201B. Furthermore, memristor 201C is connected to ground via resistor 203C (value of 10K ohms in one embodiment). Furthermore, memristor 201C is connected to switches 204E, 204G, 204H, 204I, 204J, 204K and 204L, where switches 204J, 204K are connected in parallel and the combination of switches 204J, 204K is connected in series to switch 204L. Furthermore, the combination of switches 204J, 204K and 204L is connected in parallel to the combination of switches 204G, 204H and 204I, where switches 204G, 204H and 204I are connected in series. Additionally, the combination of switches 204G, 204H and 204I is connected in parallel to switch 204E. Furthermore, switches 204G, 204I and 204K are connected to power source 202C (Vset(t)). Additionally, switch 204E is connected to power source 202B.

Additionally, as shown in FIG. 2, memristor 201D is connected in parallel to memristor 201C. Furthermore, memristor 201D is connected to ground via resistor 203D (value of 10K ohms in one embodiment). Additionally, memristor 201D is connected to switches 204M, 204N and 204O, where switches 204N and 204O are connected in series and the combination of switches 204N, 204O is connected in parallel to switch 204M. Furthermore, switches 204M, 204N are connected to power source 202C and memristor 201D is connected to power source 202D (Vcond2(t)).

Referring to the optimized full adder 200 for the shift-and-add multiplier, the P memristor (memristor 201C) has the ability to be loaded from outside of the adder or set by the sum operation. The only time the P memristor (memristor 201C) is loaded from outside of the adder is at the very beginning of the multiplication. In each subsequent intermediate addition iteration, the value of the P memristor (memristor 201C) is set by the sum logic. The P memristor (memristor 201C) is still connected to the '0' and 'A' memristors (memristors 201A, 201B, respectively) to perform in the input voltage division circuitry.

By similar logic, the multiplier bits do not need to be in a shift register. Each memristor will be sensed one iteration at a time by the drivers, to logically perform a shift without physically performing one. In iteration i, bit i is read as the B input.

Figure 3A:
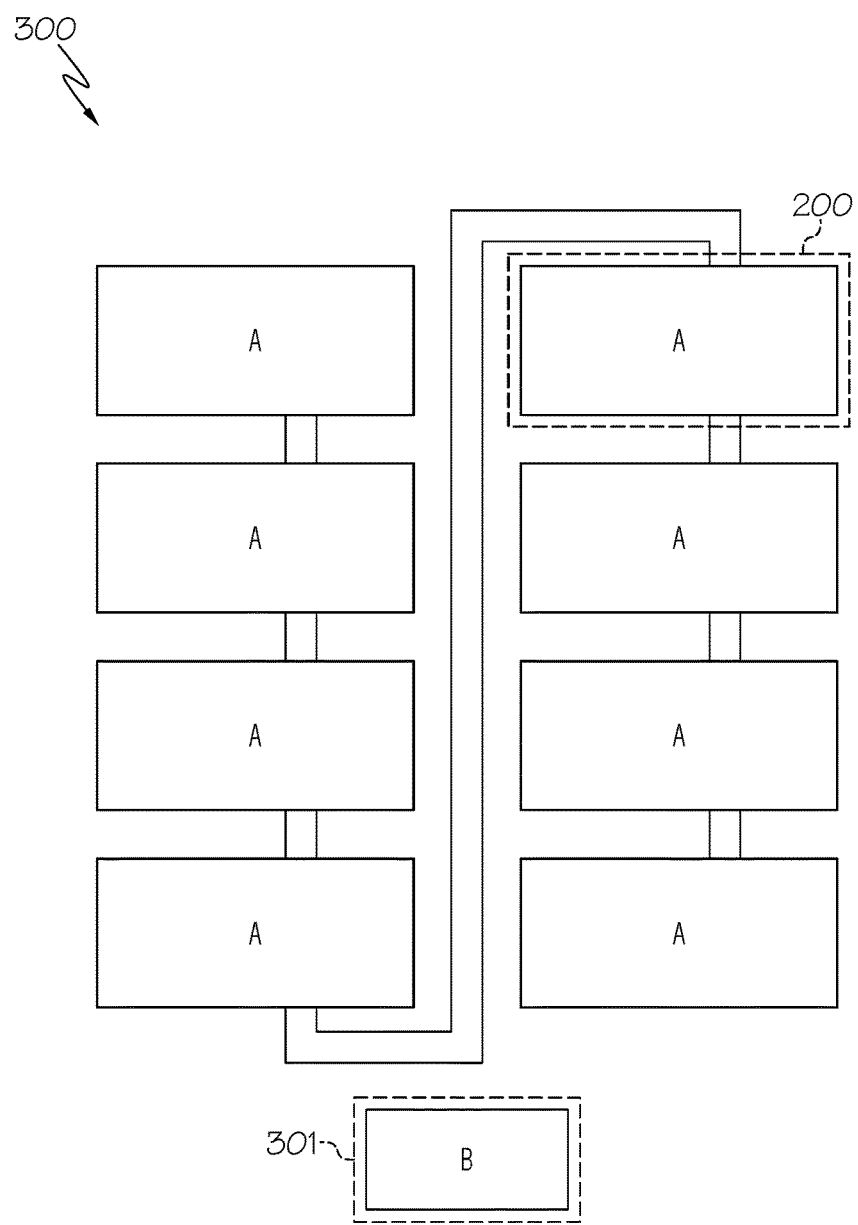
FIGS. 3A-3B illustrate an 8-bit MAD shift-and-add multiplier in accordance with an embodiment of the present invention.
Figure 3B:
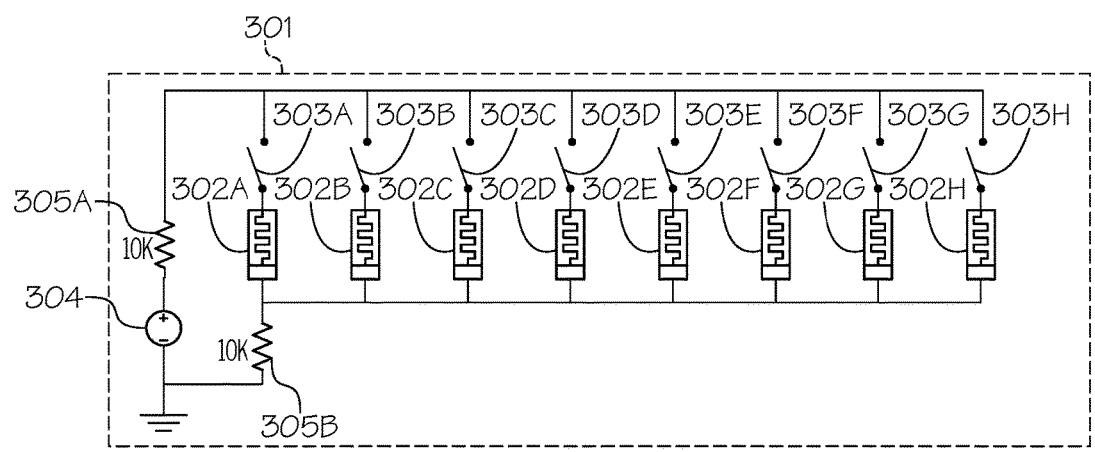

In total, the optimized design of FIG. 2 requires N replications of the modified full adder and an N-bit register. The total complexity of the design is 5N memristors, 3N+2 drivers and 16N switches. The full schematic for an 8-bit implementation can be seen in FIGS. 3A-3B. FIGS. 3A-3B illustrate an 8-bit MAD shift-and-add multiplier 300 in accordance with an embodiment of the present invention. As shown in FIG. 3A, multiplier 300 includes adder 200 of FIG. 2 (labeled as "A" in FIG. 3A). Since multiplier 300 is an 8-bit multiplier, circuitry 200 is replicated eight times as shown in FIG. 3A.

Furthermore, as shown in FIGS. 3A-3B, multiplier 300 includes circuitry 301 (labeled as "B" in FIG. 3A) that includes memristors 302A-302H that are connected to switches 303A-303H, respectively, which are connected to a power source 304 via resistor 305A (value of 10K ohms in one embodiment). Furthermore, memristors 302A-302H are connected to ground via resistor 305B (value of 10K ohms in one embodiment).

Referring to FIGS. 3A-3B, the delay of a single iteration consists of the delay of the first full adder+one step per consecutive bit for carry propagation. Thus, the total delay of an addition is N+1 steps (same as the standard MAD ripple carry adder) and the total delay for the multiplication is $N^2+N$ steps.

The MAD implementation can also be modified to accommodate pipelined additions. In one embodiment, each bit can begin the next iteration of the addition as soon as it propagates its carry-out and sum results to the next bit. In the next cycle, it receives the sum result from the next bit into its P memristor and it resets its carry-out and product memristors. Now it can start the next iteration. This implies that a new addition can occur every four cycles.

Consider bit b. When the carry-in is ready, the full adder is able to set its carry-out memristor and the previous full adder's sum memristor. In the second cycle, the full adder resets the product register. In the third cycle, bit b+1 reads bit b's carry-out memristor and resolves its sum into the P memristor in bit b. In the fourth step, bit b resets the carry-out memristor.

During each iteration of the standard shift-and-add multiplier, the least significant bit of the multiplier is used as the select line for the input A in the addition. However, with pipelining enabled, different bits of the full adder can execute different iterations during the same time step. This means that it is possible that different bits of the full adder are using different bits of the multiplier register at the same time. In order to enable this capability, the multiplier register will have N distinct drivers, one per bit. In this way, the bits of the multiplier are disjoint and can be read independently of each other and in parallel if needed.

The total throughput of the MAD shift-and-add multiplier is now every 4N steps rather than $N^2+N$.

Another type of multiplier using the MAD implementation is the Booth multiplier as discussed below in connection with FIG. 4.

In one embodiment, in the MAD design of the Booth multiplier, the multiplexer logic corresponds to a 4-to-1 multiplexer. Furthermore, in the MAD design, the multiplexer logic is incorporated into each full adder itself. To transform this logic into a 4-to-1 multiplexer, a third memristor that holds the 2's complement of the multiplicand will be added in series with the multiplicand and '0' memristor (shown in FIG. 4). This memristor will serve as a third operand to the multiplexer.

The logic that selects between these potential operands also changes. Let be the bit in the multiplier that selects the input operands in the current iteration. Originally, the value of $M_i$ was used to select either '0' (if $M_i=0$) or the multiplicand (if $M_i=1$). This was done by placing switches on each of the memristor input operands, gated by $M_i$ and $\overline{M}_i$ such that only one switch would close on a given iteration. Now the circuitry will use the values of two multiplier bits, $M_i$ and $M_{i-1}$, as shown in FIG. 4. FIG. 4 illustrates the MAD full adder 400 for the Booth multiplier in accordance with an embodiment of the present invention.

Figure 4:
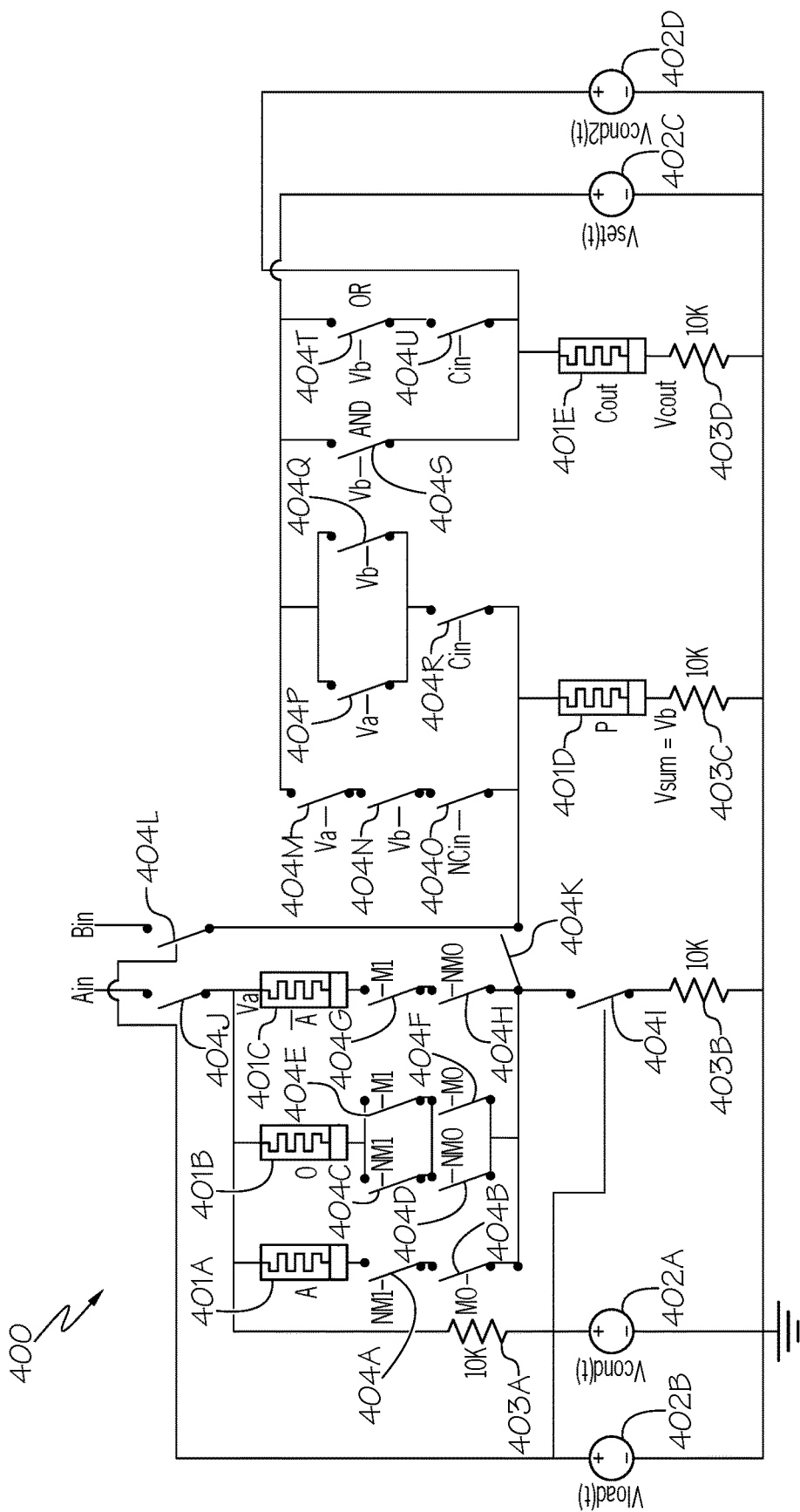
FIG. 4 illustrates the MAD full adder for the Booth multiplier in accordance with an embodiment of the present invention.

Referring to FIG. 4, adder 400 includes memristors 401A, 401B and 401C connected in parallel. Memristor 401A is connected to power source 402A (Vcond(t)) via resistor 403A (value of 10K ohms in one embodiment). Power source 402A is connected to ground as shown in FIG. 4. Furthermore, memristor 401A is connected to switches 404A, 404B, which are connected in series.

Additionally, memristor 401B is connected to power source 402A via resistor 403A (value of 10K ohms in one embodiment). Furthermore, memristor 401B is connected to switches 404C, 404D, 404E and 404F, where the combination of switches 404E, 404F are connected in series and the combination of switches 404C, 404D are connected in series. Furthermore, the combination of switches 404C, 404D is connected in parallel to the combination of switches 404E, 404F.

Furthermore, memristor 401C is connected to power source 402A via resistor 403A (value of 10K ohms in one embodiment). Additionally, memristor 401C is connected to switches 404G, 404H and 404I, where switches 404G, 404H and 404I are connected in series. Furthermore, memristors 401A-401C are connected to switch 404J, where switches 404J and 404I are connected to power source 402B (Vload (t)). Power source 402B is connected to ground and switch 404I is connected to ground via resistor 403B (value of 10K ohms in one embodiment). Additionally, there is a switch 404K between memristors 401C and 401D.

Additionally, as shown in FIG. 4, adder 400 includes memristor 401D connected in parallel to memristor 401C. Memristor 401D is connected to ground via resistor 403C (value of 10K ohms in one embodiment). Memristor 401D is connected to switches 404L, 404M, 404N, 404O, 404P, 404Q and 404R. Switch 404L is connected to power source 402B. Switches 404M, 404N and 404O are connected in series, where the combination of switches 404M, 404N and 404O is connected in parallel to switch 404L. Furthermore, switches 404P, 404Q are connected in parallel and the combination of switches 404P, 404Q is connected in series with switch 404R. Additionally, the combination of switches 404P, 404Q and 404R is connected in parallel to the combination of switches 404M, 404N and 404O. Switches 404M, 404P and 404Q are connected to power source 402C (Vset(t)).

Furthermore, as shown in FIG. 4, adder 400 includes memristor 401E connected in parallel to memristor 401D. Memristor 401E is connected to ground via resistor 403D (value of 2K ohms in one embodiment). Memristor 401E is connected to switches 404S, 404T and 404U. Switches 404T and 404U are connected in series and the combination of switches 404T, 404U is connected in parallel to switch 404S. Switches 404S and 404T are connected to power source 402C. Additionally, memristor 401E is connected to power source 402D (Vcond2(t)).

As shown in FIG. 4, the third memristor (memristor 401C) for the multiplexer is now in parallel with the original two multiplexer memristor inputs, '0' and A. The pairs of switches on each memristor correspond to the multiplier bit values which will select that input: $M_iM_{i-1}$=2'b11 and $M_iM_{i-1}$=2'b00 will select 0, $M_iM_{i-1}$=2'b01 will select A and $M_iM_{i-1}$=2'b10 will select the 2's complement of A.

The enhancement for Booth's multiplier adds one memristor and six switches to each full adder. The total complexity of the adder and multiplier register with N distinct drivers is 6N memristors, 22N switches and 4N+1 drivers.

Another type of multiplier using the MAD implementation is the array multiplier as discussed below.

In one embodiment, the MAD array multiplier design requires $5N^2-2N+2$ memristors plus driver circuitry and only 3N-4 steps for the multiplication. The optimized ripple carry adder coupled with $N^2$ MAD AND gates would require a total of (N-1)(4N memristors+(3N+1) drivers+13N switches)+$N^2$(3 memristors+1 switch)+3 drivers as a baseline. However, both the delay and area can be reduced in the context of an array multiplier.

Figure 5:
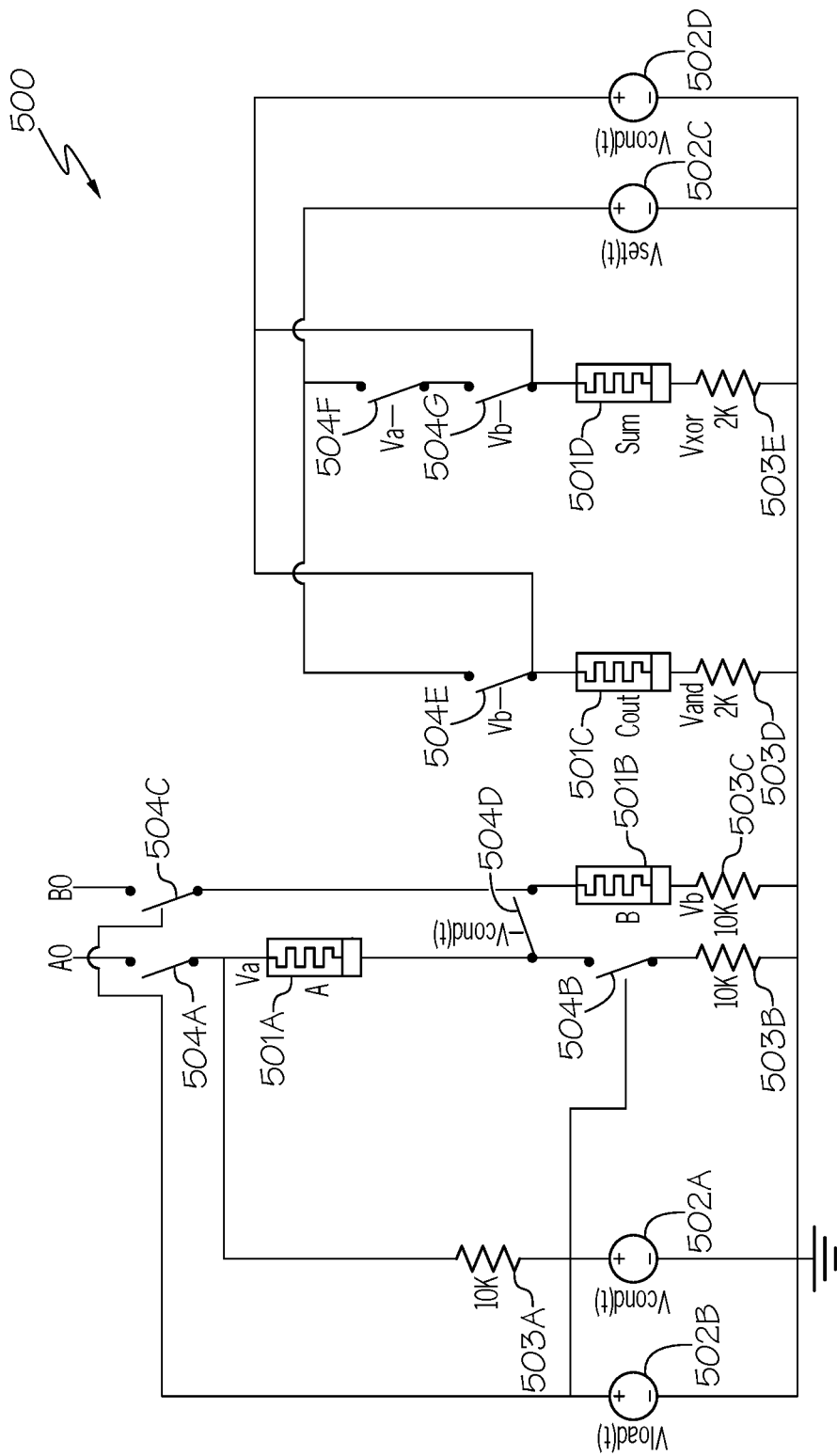
FIG. 5 illustrates a MAD half adder for the array multiplier in accordance with an embodiment of the present invention.

First, N of the full adders can be replaced with half adders. The full adders and half adders take the same form except the half adder can remove the switches corresponding to the carry-in signal. Specifically, the $C_{out}$ memristor (shown in FIG. 5) only requires one switch corresponding to the AND operation on the A and B inputs. The sum memristor (shown in FIG. 5) only requires two switches for the XOR operation on the A and B inputs. The half adder is essentially an instance of a MAD AND gate and a MAD XOR gate, both using the same inputs A and B. The MAD half adder is shown in FIG. 5. Since there are N half adders, this removes 6N switches from the design.

Referring to FIG. 5, FIG. 5 illustrates a MAD half adder 500 for the array multiplier in accordance with an embodiment of the present invention.

Referring to FIG. 5, adder 500 includes memristors 501A, 501B connected in parallel. Memristor 501A is connected to power source 502A (Vcond(t)) via resistor 503A (value of 10K ohms in one embodiment), where power source 502A is connected to ground. Additionally, memristor 501A is connected to switch 504A. Furthermore, memristor 501A is connected to switch 504B, which is connected to ground via resistor 503B (value of 10K ohms in one embodiment). Switches 504A, 504B are also connected to power source 502B (Vload(t)).

Memristor 501B is connected to ground via resistor 503C (value of 10K ohms in one embodiment). Furthermore, memristor 501B is connected to switch 504C, which is connected to power source 502B. Additionally, there is a switch 504D between memristors 501A, 501B which is driven by Vcond(t).

Furthermore, as shown in FIG. 5, memristor 501C is connected in parallel to memristor 501B. Memristor 501C is connected to ground via resistor 503D (value of 2K ohms in one embodiment). Furthermore, memristor 501C is connected to switch 504E which is connected to power source 502C (Vset(t)). Also, memristor 501C is connected to power source 502D (Vcond2(t)).

Additionally, adder 500 includes memristor 501D which is connected in parallel to memristor 501C. Memristor 501D is connected to ground via resistor 503E (value of 2K ohms in one embodiment). Furthermore, memristor 501D is connected to switches 504F, 504G. Switches 504F, 504G are connected in series. Furthermore, switch 504F is connected to power source 502C. Additionally, memristor 501D is connected to power source 502D.

Furthermore, the copy operations can be removed from the design. MAD copy operations are cheaper than IMPLY copy operations, requiring a single step instead of two. However, the design can still noticeably benefit from their removal. There are a total of N−1 copy operations along the critical path of the design, contributing N−1 steps to the overall delay. All of these steps can be removed from the critical path.

The full adders are optimized to store their sum into the input memristor in the adder which uses this value as an input. The process is the same as described for the shift-and-add multiplier. Thus, each sum will be resolved into either the A or B input in the "next" full adder in the chain by applying $V_{set}$ to the memristor in the next full adder rather than the current full adder. Now, almost every intermediate adder can remove its local sum memristor. These full adders now only require three memristors.

The full adders in the final row of the array do not perform this optimization. They require their sum memristor since they are the final full adders in the design and hold the final product result. Note, if this design is incorporated into a larger block, it may be possible to remove the sum memristors in the final full adders and store the result directly into another block's memristors in the complete system. In all, (N−2)(N−1)−1 full adders can perform the optimization, removing $N^2-3N+1$ memristors from the full adders.

The optimization may only be performed on one of the half adders for the same reason. Only the final half adder in the first row of the design does not resolve a final product bit. This full adder can store its sum result into the next full adder in the array. This removes one more memristor from the design.

The carry-out memristor in each adder cannot be removed in the same manner. The carry-out signal stored in a memristor is needed so that both the p and n terminals can be sensed for voltages. The voltages of the nodes on the carry-out signals are used to drive switches in the subsequent adders. There is not a resident memristor in the subsequent adder to copy the carry-out into. Thus, it is stored in the local adder.

The one exception to this rule is the Nth adder in each ripple carry adder and the full adder which feeds the half adder in the first row. The carry-out of these adders serves as one of the A or B inputs to the next adder, thus it can be stored into the next full adder in its respective input memristor. For these adders, the $C_{out}$ memristor can be removed from the full adder itself. N−1 adders can remove their carry-out memristors. This removes memristors from the design but does not remove any switches or drivers. Rather it just moves these switches and drivers onto the next adder's logic.

Each of these steps removes unnecessary memristors due to shared inputs and outputs. The first step removed $N^2$−3N+2 memristors and the second removed N−1. The total savings is $N^2$−2N+1 memristors.

Lastly, a cross-approach optimization may be performed. In one embodiment, the $N^2$ AND gates is implemented with hybrid-CMOS gates. The hybrid-CMOS approach is the most efficient at single-gate implementations that do not need to be incorporated into a logic-in-memory context. They have a gate delay of one and fewer components.

The hybrid-CMOS technique suffers in high fan-out or high concatenation situations. In the array multiplier, the $N^2$ AND gates execute once and only once and have a fan-out of one. Each gate's result is stored in a memristor in a single full adder. Thus, the concatenation of the signals lifetime is a single gate. Thus, one can perform all of the AND operations with hybrid-CMOS gates and use them directly as the inputs to the B inputs during the initialization sequence of the inputs into the array. For the adders which use AND gates for both of their inputs, the second AND gate will feed the A input during the initialization sequence. The resultant schematic for the proposed MAD-based array multiplier 600 is shown in FIGS. 6A-6C in accordance with an embodiment of the present invention.

Figure 6A:
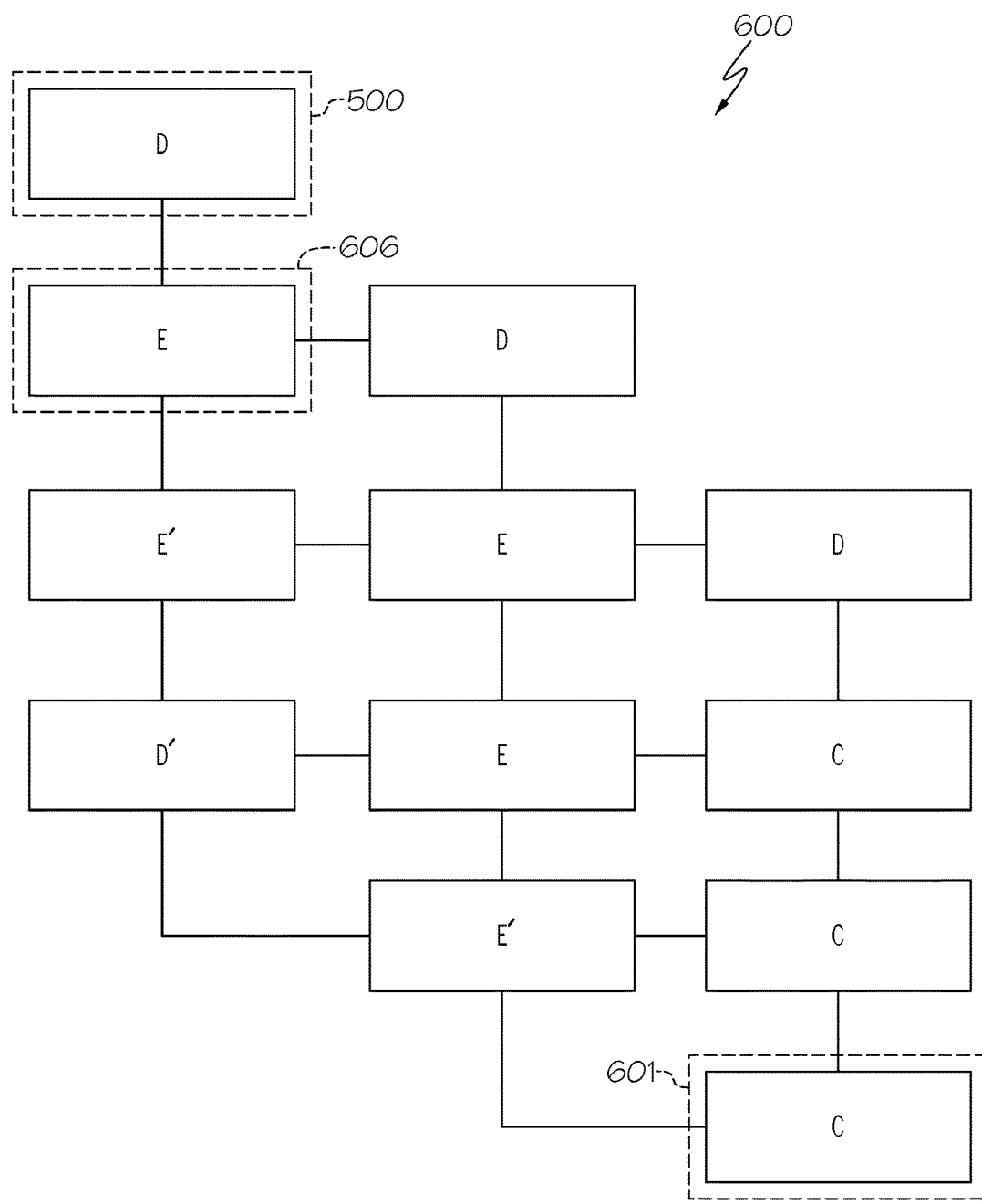
FIGS. 6A-6C illustrate a MAD-based array multiplier in accordance with an embodiment of the present invention.
Figure 6B:
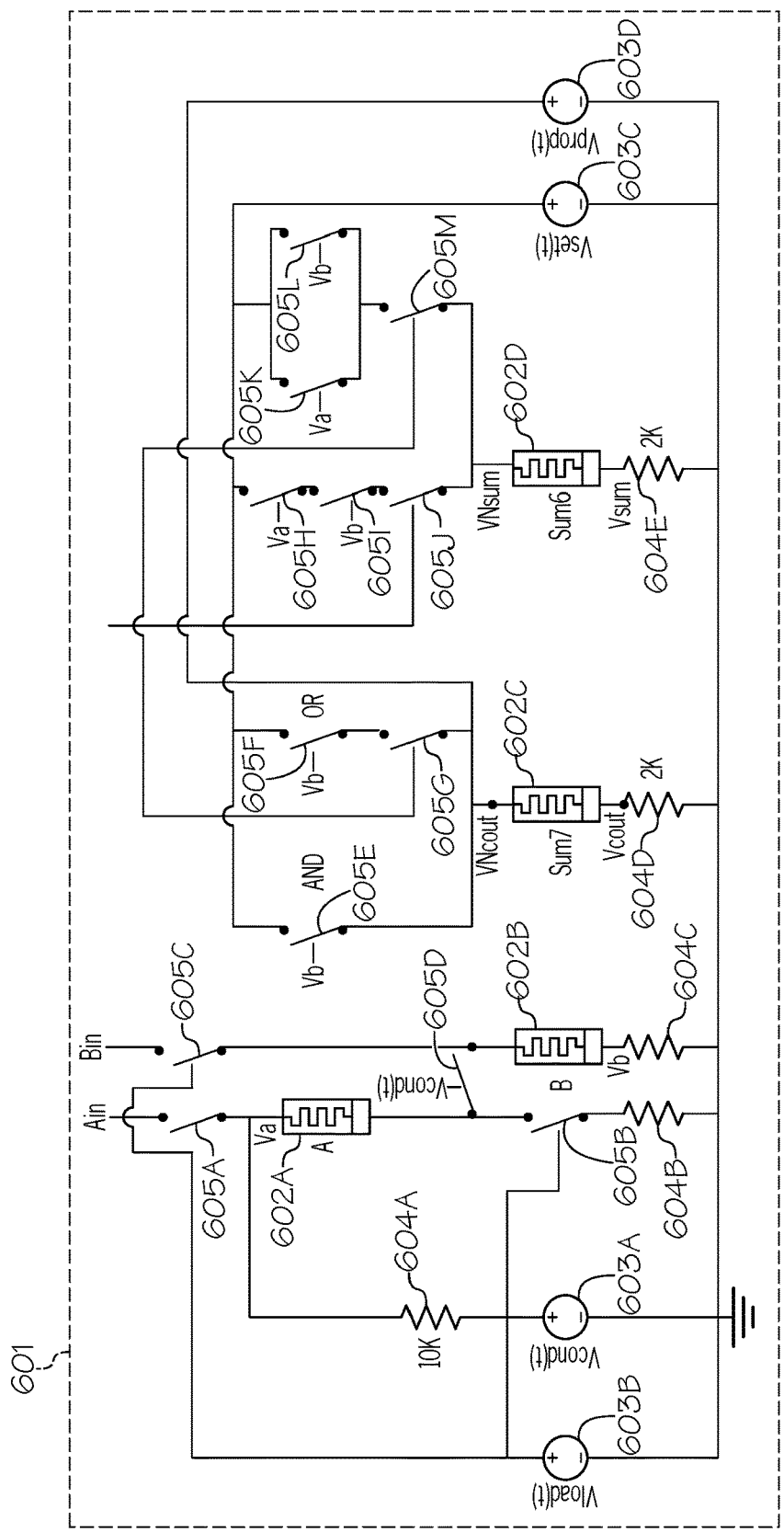
Figure 6C:
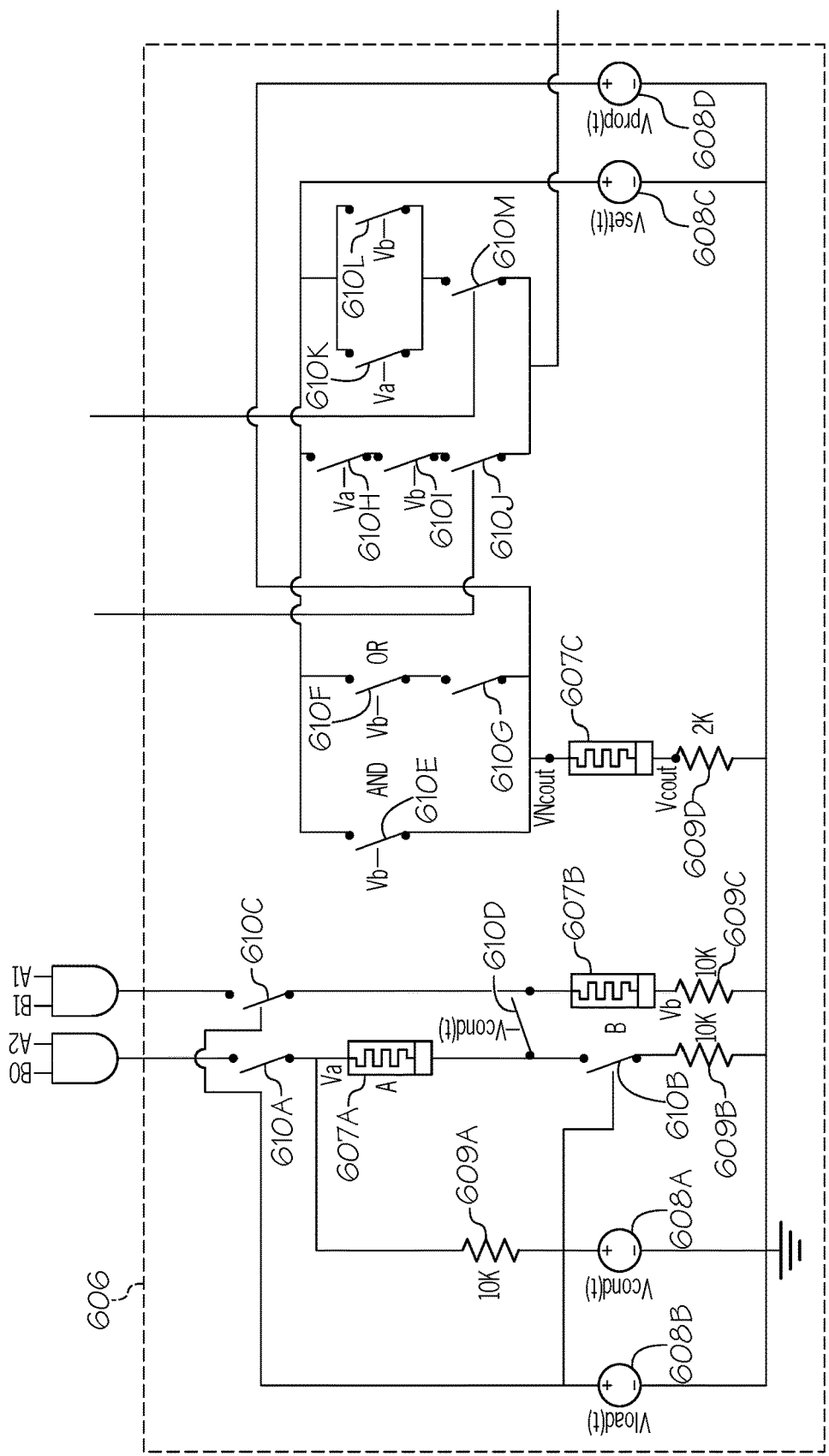

Such a design decision as shown in FIGS. 6A-6C removes $3N^2$ memristors, $2N^2$ switches and three drivers from the design. It replaces these with $2N^2$ memristors for the hybrid-CMOS gates. The net reduction in hardware is $N^2$ memristors, $2N^2$ switches and three drivers.

The final design requires $5N^2$−2N−1 memristors, $3N^2$−2N−1 drivers and $13N^2$−13N switches. Together, all of the optimizations reduce the delay to essentially one step per full adder on the critical path. The total delay is one step for the initial AND, N−1 for the initial ripple carry adder, one step each for N−3 full adder traversals and N steps for the final ripple carry adder. The total number of steps is 3N−3 steps for an N-bit multiplication.

Referring to FIGS. 6A-6B, multiplier 600 includes circuitry 601 (labeled as "C" in FIG. 6A) that includes memristors 602A, 602B connected in parallel. Memristor 602A is connected to power source 603A (Vcond(t)) via resistor 604A (value of 10K ohms in one embodiment), where power source 603A is connected to ground. Additionally, memristor 602A is connected to switch 605A. Furthermore, memristor 602A is connected to switch 605B, which is connected to ground via resistor 604B (value of 10K ohms in one embodiment). Switches 605A, 605B are also connected to power source 603B (Vload(t)).

Memristor 602B is connected to ground via resistor 604C (value of 10K ohms in one embodiment). Furthermore, memristor 602B is connected to switch 605C, which is connected to power source 603B. Additionally, there is a switch 605D between memristors 602A, 602B which is driven by Vcond(t).

Additionally, as shown in FIG. 6B, circuitry 601 includes memristor 602C, which is connected in parallel to memristor 602B. Furthermore, memristor 602C is connected to ground via resistor 604D (value of 10K ohms in one embodiment). Additionally, memristor 602C is connected to switches 605E, 605F and 605G, where switches 605F, 605G are connected in series and the combination of switches 605F, 605G is connected in parallel to switch 605E. Furthermore, switches 605E, 605F are connected to power source 603C (Vset(t)) and memristor 602C is connected to power source 603D (Vprop(t)).

Furthermore, as shown in FIG. 6B, circuitry 601 includes memristor 602D, which is connected in parallel to memristor 602C. Memristor 602D is connected to ground via resistor 604E (value of 10K ohms in one embodiment). Additionally, memristor 602D is connected to switches 605H, 605I, 605J, 605K, 605L and 605M, where switches 605K, 605L are connected in parallel and the combination of switches 605K, 605L is connected in series to switch 605M. Furthermore, the combination of switches 605H, 605I and 605J is connected in parallel to the combination of switches 605K, 605L and 605M, where switches 605H, 605I and 605J are connected in series. Furthermore, switches 605H, 605K and 605L are connected to power source 603C.

Circuitry 601 is then replicated in multiplier 600 as shown in FIG. 6A.

Referring to FIGS. 6A and 6C, multiplier 600 further includes circuitry 606 (labeled as "E" in FIG. 6A) that includes memristors 607A, 607B connected in parallel. Memristor 607A is connected to power source 608A (Vcond(t)) via resistor 609A (value of 10K ohms in one embodiment), where power source 608A is connected to ground. Additionally, memristor 607A is connected to switch 610A. Furthermore, memristor 607A is connected to switch 610B, which is connected to ground via resistor 609B (value of 10K ohms in one embodiment). Switches 610A, 610B are also connected to power source 608B (Vload(t)).

Memristor 607B is connected to ground via resistor 609C (value of 10K ohms in one embodiment). Furthermore, memristor 607B is connected to switch 610C, which is connected to power source 608B. Additionally, there is a switch 610D between memristors 607A, 607B which is driven by Vcond(t).

Additionally, as shown in FIG. 6C, circuitry 606 includes memristor 607C, which is connected in parallel to memristor 607B. Furthermore, memristor 607C is connected to ground via resistor 609D (value of 10K ohms in one embodiment). Additionally, memristor 607C is connected to switches 610E, 610F and 610G, where switches 610F, 610G are connected in series and the combination of switches 610F, 610G is connected in parallel to switch 610E. Furthermore, switches 610E, 610F are connected to power source 608C (Vset(t)) and memristor 607C is connected to power source 608D (Vprop(t)).

Furthermore, as shown in FIG. 6C, circuitry 606 includes switches 610H, 610I, 610J, 610K, 610L and 610M. Switches 610K and 610L are connected in parallel and the combination of switches 610K and 610L is connected in series with switch 610M. Furthermore, switches 610H, 610I and 610J are connected in series. Additionally, the combination of switches 610K, 610L and 610M is connected in parallel to the combination of switches 610H, 610I and 610J. Switches 610K, 610L are connected to power source 608C. Switch 610M is connected to memristor 501C of adder 500. Additionally, switch 610J is connected to resistor 503D of adder 500.

Circuitry 606 is then replicated in multiplier 600 as shown in FIG. 6A.

Multiplier 600 further includes adder 500 (labeled as "D" in FIG. 6A), which is replicated in multiplier 600 as shown in FIG. 6A. Additionally, multiplier 600 includes variations of adder 500 (labeled as "D'" in FIG. 6A), where memristors 501C, 501D and resistors 503D, 503E are not utilized.

Additionally, multiplier 600 includes variations of circuitry 606 (labeled as "E'" in FIG. 6A), where memristor 607C and resistor 609D are not utilized.

Another benefit of the design of multiplier 600 of FIGS. 6A-6C is its ability to be pipelined. Similar to the ripple carry adder, the array multiplier can be pipelined at the granularity of a full adder. Since the delay of a full adder has not changed for the array multiplier, it is still possible to pipeline multiplications such that a new multiplication begins every four steps. Once an adder has resolved its $C_{out}$ and sum bits, whether it be into a local memristor or another adder's memristor, it can reset its memristors and accept its next two inputs.

Alternatively, the hardware can be pipelined within a single multiplication. Rather than pipeline multiplications through the adders, the design will have a single row of adders that the computation is pipelined through. To accommodate this, the drivers of the design are changed. Now, when each full adder computes its sum and carry-out, its sum will be stored into the full adder before it. This full adder will logically represent the "next" adder in the traditional array multiplier.

To accommodate this, each full adder now takes two steps. The first step computes and stores the sum. The second step resets the internal memristors to accept the next full adder's value. Now, the delay of an N-bit full adder is 2N steps. Since the design logically implements N-1 ripple carry adders, the total delay for an N-bit multiplication is $2N^2-2N$ steps. Although this is significantly higher, the complexity is reduced to a single row of the adder with the $N^2$ hybrid-CMOS gates.

As a result of employing MAD gates in memristor-based multipliers, the number of delay steps may be less than half than the number of delay steps required in traditional CMOS implementations of multipliers. Furthermore, by using MAD gates, memristor-based multipliers can be implemented with less complexity (e.g., fewer memristors and drivers). As a result, by the memristor-based multipliers using MAD gates, the speed and complexity of a wide variety of arithmetic operations is improved.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

The invention claimed is:

1. An array multiplier, comprising:
   a first memristor connected to a first power source, a first switch and a second switch;
   a second memristor connected in parallel to said first memristor, wherein said second memristor is connected to a third switch, wherein a fourth switch is connected to said first and second memristors;
   a third memristor connected in parallel to said second memristor, wherein said third memristor is connected to a fifth switch; and
   a fourth memristor connected in parallel to said third memristor, wherein said fourth memristor is connected to a sixth switch and a seventh switch.

2. The array multiplier as recited in claim 1, wherein said first memristor is connected to said first power source via a resistor.

3. The array multiplier as recited in claim 2, wherein said second and third switches are connected to a second power source.

4. The array multiplier as recited in claim 1, wherein said fifth switch is connected to a third power source, wherein said third memristor is connected to a fourth power source.

5. The array multiplier as recited in claim 4, wherein said sixth and seventh switches are connected in series, wherein said fourth memristor is connected to said fourth power source.

6. The array multiplier as recited in claim 5, wherein said second, third and fourth memristors are connected to ground via a resistor.

7. An array multiplier, comprising:
   a first memristor connected to a first power source, a first switch and a second switch;
   a second memristor connected in parallel to said first memristor, wherein said second memristor is connected to a third switch, wherein a fourth switch is connected to said first and second memristors;
   a third memristor connected in parallel to said second memristor, wherein said third memristor is connected to a fifth switch, a sixth switch and a seventh switch; and
   a fourth memristor connected in parallel to said third memristor, wherein said fourth memristor is connected to an eighth switch, a ninth switch, a tenth switch, an eleventh switch, a twelfth switch and a thirteenth switch.

8. The array multiplier as recited in claim 7, wherein said first memristor is connected to said first power source via a resistor.

9. The array multiplier as recited in claim 8, wherein said first, second and third switches are connected to a second power source.

10. The array multiplier as recited in claim 7, wherein said sixth and seventh switches are connected in series, wherein a combination of said sixth and seventh switches is connected in parallel to said fifth switch.

11. The array multiplier as recited in claim 10, wherein said eighth, ninth and tenth switches are connected in series, wherein said eleventh and twelfth switches are connected in parallel, wherein a combination of said eleventh and twelfth switches is connected in series with said thirteenth switch, wherein a combination of said eleventh, twelfth and thirteenth switches is connected in parallel to a combination of said eighth, ninth and tenth switches.

12. The array multiplier as recited in claim 11, wherein said fifth, sixth, eighth, eleventh and twelfth switches are connected to a third power source.

13. The array multiplier as recited in claim 12, wherein said third memristor is connected to a fourth power source.

14. The array multiplier as recited in claim 7, wherein said second, third and fourth memristors are connected to ground via a resistor.

* * * * *